(12) United States Patent
Hwang et al.

(10) Patent No.: US 7,881,133 B2
(45) Date of Patent: Feb. 1, 2011

(54) METHOD OF MANAGING A FLASH MEMORY AND THE FLASH MEMORY

(75) Inventors: Sangwon Hwang, Suwon-si (KR); Jong-Soo Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 308 days.

(21) Appl. No.: 12/003,140

(22) Filed: Dec. 20, 2007

(65) Prior Publication Data

US 2008/0209282 A1  Aug. 28, 2008

Related U.S. Application Data

(63) Continuation-in-part of application No. 11/605,977, filed on Nov. 30, 2006, now Pat. No. 7,757,153.

(30) Foreign Application Priority Data

Mar. 31, 2006  (KR) .................... 10-2006-0029691

(51) Int. Cl.
*G11C 29/00* (2006.01)
(52) U.S. Cl. ............. 365/200; 365/185.09; 365/185.03
(58) Field of Classification Search ................. 365/200, 365/185.09, 185.03, 230.03
See application file for complete search history.

(56) References Cited

U.S. PATENT DOCUMENTS

| | | |
|---|---|---|
| 4,608,687 A | 8/1986 | Dutton |
| 5,280,013 A | 1/1994 | Newman et al. ............ 505/330 |
| 5,452,429 A | 9/1995 | Fuoco et al. |
| 5,475,693 A | 12/1995 | Christopherson et al. |
| 5,559,956 A | 9/1996 | Sukegawa |
| 5,784,548 A | 7/1998 | Liong et al. |
| 5,920,502 A | 7/1999 | Noda et al. |
| 6,002,612 A | 12/1999 | Noda et al. |
| 6,046,939 A | 4/2000 | Noda et al. |
| 6,204,139 B1 | 3/2001 | Liu et al. .................... 438/385 |
| 6,249,014 B1 | 6/2001 | Bailey ........................ 257/295 |

(Continued)

FOREIGN PATENT DOCUMENTS

JP   2001-210082   8/2001

(Continued)

OTHER PUBLICATIONS

Beck, A. et al., "Reproducible switching effect in thin oxide films for memory applications," Applied Physics Letters, vol. 77, No. 1, Jul. 3, 2000, 139-141.

(Continued)

*Primary Examiner*—Viet Q Nguyen
(74) *Attorney, Agent, or Firm*—Harness, Dickey & Pierce, P.L.C.

(57) ABSTRACT

One embodiment of the method includes determining a type of cells in a block of the flash memory if an error is detected in at least a portion of the block, and selectively changing one of a cell type indicator and a bad block indicator associated with the block based on the determined type of cells in the block. The cell type indicator indicates a type of the cells in the associated block, and the bad block indicator indicates whether the associated block is a usable block.

36 Claims, 10 Drawing Sheets

U.S. PATENT DOCUMENTS

| | | | |
|---|---|---|---|
| 6,266,273 B1 | 7/2001 | Conley et al. | 365/185 |
| 6,349,390 B1 | 2/2002 | Dell et al. | |
| 6,353,553 B1 | 3/2002 | Tamada et al. | |
| 6,442,726 B1 | 8/2002 | Knefel | |
| 6,456,525 B1 | 9/2002 | Perner et al. | 365/171 |
| 6,549,459 B2 | 4/2003 | Higuchi | |
| 6,569,745 B2 | 5/2003 | Hsu | 438/385 |
| 6,697,976 B1 | 2/2004 | Satoh et al. | |
| 6,715,116 B2 | 3/2004 | Lester et al. | |
| 6,856,536 B2 | 2/2005 | Rinerson et al. | 365/148 |
| 6,927,430 B2 | 8/2005 | Hsu | 257/235 |
| 7,333,364 B2 * | 2/2008 | Yu et al. | 365/185.09 |
| 7,345,928 B2 * | 3/2008 | Li | 365/189.05 |
| 2003/0001178 A1 | 1/2003 | Hsu et al. | 257/296 |
| 2004/0036065 A1 | 2/2004 | Doan et al. | 257/3 |
| 2004/0202034 A1 | 10/2004 | Lee | 365/202 |
| 2005/0158994 A1 | 7/2005 | Zhuang et al. | 438/663 |
| 2008/0177922 A1 * | 7/2008 | Chow et al. | 710/302 |

FOREIGN PATENT DOCUMENTS

| | | |
|---|---|---|
| JP | 2003-022687 | 1/2003 |
| KR | 10-205240 | 4/1999 |
| KR | 10-0283726 | 12/2000 |
| KR | 2001-0077868 | 8/2001 |
| KR | 10-332950 | 4/2002 |
| KR | 2003-0023349 | 3/2003 |
| KR | 10-0406612 | 11/2003 |
| KR | 10-0447969 | 8/2004 |
| KR | 10-2005-0116283 | 12/2005 |
| WO | WO 96/20443 | 7/1996 |

OTHER PUBLICATIONS

Liu, S.Q., et al., "Electric-pulse-induced reversible resistance change effect in magnetoresistive films", Applied Physics Letters, vol. 76, No. 19, May 8, 2000, 2749-2651.

Liu, S. Q., et al., "A New Concept for Non-Volatile Memory: Electric-Pulse Induced Reversible Resistance Change Effect in Magnetoresistive Films", Space Vacuum Epitaxy Center, University of Huston, Huston TX, 7 Pages, 2001.

Park, In Seon et al., "Ultra-thin EBL (encapsulated barrier layer) for Ferroelectric Capacitor," IDEM, vol. 97, 617-620, 1997.

Rossel, C. et al., "Electrical current distribution across a metal-insulator-metal structure during bistable switching," Journal of Applied Physics, vol. 90, No. 6, Sep. 15, 2001, 2892-2898.

Watanabe, Y. et al., "Current-driven insulator-conductor transition and nonvolatile memory in chromium-doped $SrTiO_3$ single crystals," Applied physics Letters, vol. 78, No. 23, Jun. 4, 2001, 3738-3740.

Yoon, Dong-Soon et al., "High Performance of Novel Oxygen Diffusion Barrier Materials for Future High-Density Dynamic Random Access Memory Devices," IEEE Transactions on Electron Devices, vol. 49, No. 11, Nov. 2002, 1917-1927.

Wolf, Ph.D.., Stanley, Richard N. Tauber, Ph.D., "Aluminum Thin Films and Physical Vapor Deposition in VLSI," Silicon Processing for the VLSI Era-vol. 1: Process Technology, Lattice Press, 1986, pp. 335, 367.

Wolf, Ph.D., Stanley, "Contact Technology and Local Interconnects for VLSI," Silicon Processing for the VLSI Era-vol. 2: Process Integration, Lattice Press, 1986, pp. 121-123.

US Notice of Allowance for counterpart U.S. Appl. No. 11/605,977 dated Feb. 26, 2010.

* cited by examiner

2-Level/cell → 1bit/cell

4-Level/cell → 2bit/cell

METHOD OF MANAGING A FLASH MEMORY AND THE FLASH MEMORY

DOMESTIC PRIORITY INFORMATION

This application is a continuation-in-part application under 35 U.S.C. 120 on U.S. application Ser. No. 11/605,977, filed Nov. 30, 2006 now U.S. Pat. No. 7,757,153, the entire contents of which are hereby incorporated by reference in their entirety.

FOREIGN PRIORITY INFORMATION

This application claims priority under 35 U.S.C. 119 on Korean Application No. 10-2006-0029691 filed Mar. 31, 2006, the entire contents of which are hereby incorporated by reference in their entirety.

BACKGROUND

The present invention relates to flash memory.

Flash memories are commonly applicable to mass storage subsystems for electronic devices employed in mobile communications, game sets, and so forth. Such subsystems are usually implemented as either removable memory cards that can be inserted into multiple host systems or as non-movable embedded storage within the host systems. In both implementations, the subsystem includes one or more flash devices and often a subsystem controller.

Flash memories are composed of one or more arrays of transistor cells, each cell capable of non-volatile storage of one or more bits of data. Therefore, flash memories do not require power to retain the data programmed therein. Once programmed however, a cell must be erased before it can be reprogrammed with a new data value. These arrays of cells are partitioned into groups to provide for efficient implementation of read, program and erase functions. The typical flash memory architecture for mass storage arranges large groups of cells into erasable blocks. Each block is further partitioned into one or more addressable sectors or pages that are the basic unit for read and program functions.

Flash memories basically have their own functional operations of reading, writing (or programming), and erasing. Another function is to maintain the integrity of data stored in the flash memory. To this end, the subsystem typically includes an error detection and correction unit. However, at times even use of the error detection and correction is not sufficient. Namely, as a cell is erased, programmed, etc. the cell degrades, and a cell may degrade to the point of being unusable for storing data. Accordingly, flash memories by perform a copy back operation to move data from one erasable block including one or more unusable cells to a free data block that does not include an unusable cell. To manage these bad blocks, a spare area of the memory array may include bad block flags corresponding to each block. The bad block flag indicates whether the corresponding erasable block is bad (i.e., includes an unusable cell) or not.

FIG. 1 illustrates a conventional flash memory system. As shown, a controller 120 controls the operation of one or more flash memory devices 125 via an input/output (I/O) interface 118. In FIG. 1, only one flash memory device 125 has been shown for the sake of clarity. The flash memory device includes an array 100 of transistor cells, each cell capable of non-volatile storage of one or more bits of data. The arrays of cells are partitioned into groups of cells referred to as erasable blocks 116. Each block 116 is further partitioned (not shown) into one or more addressable sectors or pages that are the basic unit for read and program functions. As further shown, the array 100 is divided into a main area 110 and a spare area 112. The main area 310 stores data as is well-known, and the spare area 112 includes bad block flags 114 corresponding to each block 116. The bad block flag 114 indicates whether the corresponding erasable block 116 is bad (i.e., includes an unusable cell) or not.

An address decoding and control unit receives controls signals over the input/output interface 118 (e.g., a bus and/or buffer) from the controller 120. These signals may include, for example, a chip select signal (CS) used to active the flash memory, a read strobe (RS) signal used to indicate a data read operation, a write strobe (WS) signal used to indicate a write operation, and an address signal used to indicate the address of the memory array 100 associated with the read or write operation. Based on the control signals, the address decoding and control unit 108 generates control signals for controlling the memory array 100, a page buffer unit 102 and a column gating unit 104 in the well-known manner. For example, the address and decoding control unit 108 controls the memory array 100, page buffer unit 102 and column gating unit 104 to perform read, program and erase operations consistent with read and write operations indicated by the control signals.

The page buffer unit 102 includes a plurality of page buffers (not shown), each associated with a column or columns of the memory array 100. Each page buffer stores data read from or for being written to a memory cell or cells in the associated column of the memory array 100. Each page buffer selectively operates based on the control signals from the address decoding and control unit 108. The column gating unit 104 selectively outputs the data from or inputs data to one of the page buffers in the page buffer unit 102 based on the control signals from the address decoding and control unit 108. The column selecting unit 104 is connected to the I/O interface via an error detection and correction unit 106, sends the read data over the I/O interface 118, and receives data for writing via the I/O interface 118. It will be appreciated that the data may be received and sent by the controller 120 or another external device.

The error detection and correction (ECC) unit 106 detects errors in the data to be written into or read from the memory array 110, and corrects the errors according to any well-known error correction scheme. However, because of a degraded memory cell, the errors in read data may be too large for the ECC unit 106 to correct. This ECC failure may be reported to the controller 120, which recognizes the read cells as including a cell which has degraded to being unusable—an unusable cell.

The controller 120 also detects unusable cells of the array 300 in other ways. For example, one technique for detecting such cells is to verify that program and/or erase operations have completed satisfactorily. Any well-known verify technique may be used. A verification failure results in a determination that the cell or cells in question are unusable.

If the controller 120 detects unusable cells, the bad block flag 114 in the spare area 112 associated with the block 116 including the detected unusable cells is set. The controller 120 may also conduct a copy back operation in which the data of the block marked as bad is copied to a free block, which does not include unusable cells. For example, assume the nth page of a block is determined to include unusable cells as a result of a failed verification process during a write operation to the nth page. The controller 120 issues control signals to copy the first to (n−1)th pages of the block to the first to (n−1)th pages of a free block, writes the nth page in the free block pursuant to the write operation, and copies the remaining n+1, n+2, etc. pages of the unusable block to the free block. It will be appreciated that the controller 120 may maintain, for example, a table or other management data regarding which blocks are free. This management information may be stored locally at the controller, in the flash memory device, etc. The controller 120 also sets the bad block flag for the unusable block. For example, the memory cell forming the bad block flag may be programmed to indicate that the corresponding block is unusable.

As discussed above, degradation causes the transistor cell to become unusable. In particular, over the course of many program and erase cycles, the erasure and program threshold voltages change. FIG. 2A illustrates the erasure and program threshold voltages of a useable transistor cell. As shown a large margin between the erasure and program threshold voltages initially exists, and it is easier to distinguish if the cell is erased or programmed. However, over the course of many program and erase cycles, the margin between the erasure and program threshold voltages decreases, and may decrease to a point where the margin is no longer sufficient to provide for consistently distinguishing between the erased and programmed states.

This situation becomes more pronounced with multiple level transistor cells, also referred to as MLCs. Unlike the single level cell (SLC) discussed above with respect to FIG. 2A, an MLC includes more than two threshold voltage states. A SLC includes two threshold voltage states where each state represents either a logic 1 or a logic 0 (i.e., a SLC stores 1 bit of data). A four level MLC includes four threshold states, and each state represents two bits of data. FIG. 2B illustrates the threshold states and associated bits for an example, useable four level MLC. As will be appreciated, the threshold margin between these states is significantly less than for a SLC. As a result, a MLC may become unusable in less time than an SLC as a result of degradation. Furthermore, because an MLC stores more data than an SLC, the loss of a MLC results in a greater loss of storage capacity.

SUMMARY OF THE INVENTION

The present invention relates to a method of managing a flash memory.

One embodiment of the method includes determining a type of cells in a block of the flash memory if an error is detected in at least a portion of the block, and selectively changing one of a cell type indicator and a bad block indicator associated with the block based on the determined type of cells in the block. The cell type indicator indicates a type of the cells in the associated block, and the bad block indicator indicates whether the associated block is a usable block.

According to another embodiment, the flash memory includes at least one of i-value cells and j-value cells. Each i-value cell is for storing i-bits of data and each j-value cell is for storing j-bits of data, where j is greater than i. Whether a block in the flash memory includes one i-value cells and j-value cells is determined if an error is detected in at least a portion of a block. One of a cell type indicator and a bad block indicator associated with the block is selectively changed based on the determining step. The cell type indicator indicates a type of the cells in the associated block, and the bad block indicator indicates whether the associated block is a usable block.

According to yet another embodiment, a storage capacity of a block indicated by an associated storage capacity indicator is reduced if an error in at least a portion of the block is detected and a current storage capacity indicated by the associated storage capacity indicator is greater than a first threshold number. The storage capacity indicator indicates a bit storage capacity of cells in the associated block. A bad block indicator of a block associated with the bad block indicator is changed to indicate the associated block is unusable if an error in at least a portion of the block is detected and the current storage capacity indicated by the associated storage capacity indicator is equal to a second threshold number.

The present invention is also related to a flash memory system.

In one embodiment, the flash memory system includes a memory cell array divided into a plurality of blocks, and an error detecting unit configured to detect an error in at least a portion of a block. A controller is configured to determine a type of cells in the block in response to an error being detected in at least a portion of the block, and is configured to selectively change one of a cell type indicator and a bad block indicator associated with the block based on the determination. The cell type indicator indicates a type of the cells in the associated block, and the bad block indicator indicates whether the associated block is a usable block.

In another embodiment, the flash memory system includes a memory cell array divided into a plurality of blocks, and a controller configured to determine a type of cells in a block in response to detection of an error in the block. The controller is further configured to selectively change one of a cell type indicator and a bad block indicator associated with the block based on the determination. The cell type indicator indicates a type of the cells in the associated block, and the bad block indicator indicates whether the associated block is a usable block.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF EXAMPLE EMBODIMENTS

Figure 1:
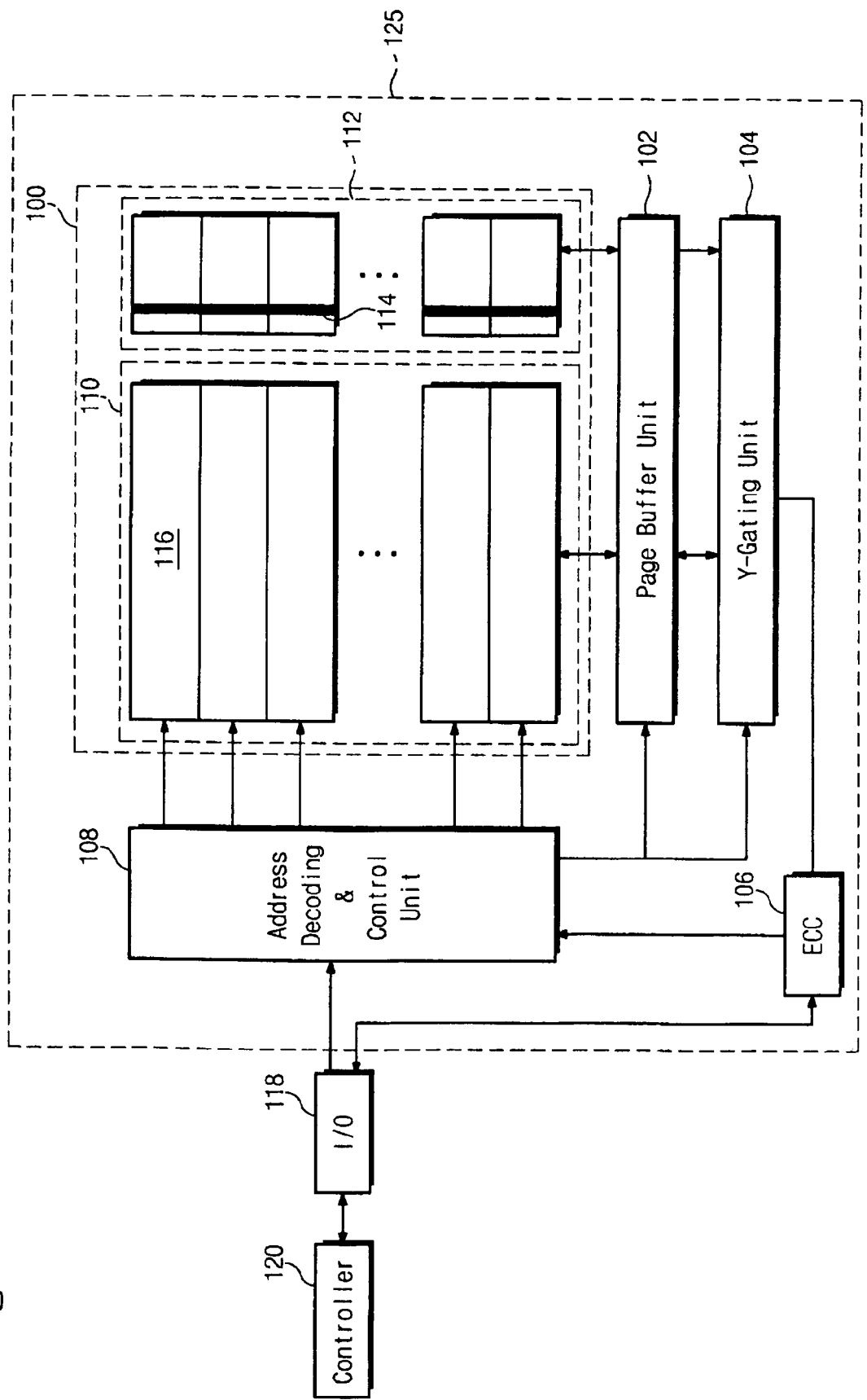
FIG. 1 illustrates a conventional flash memory system.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
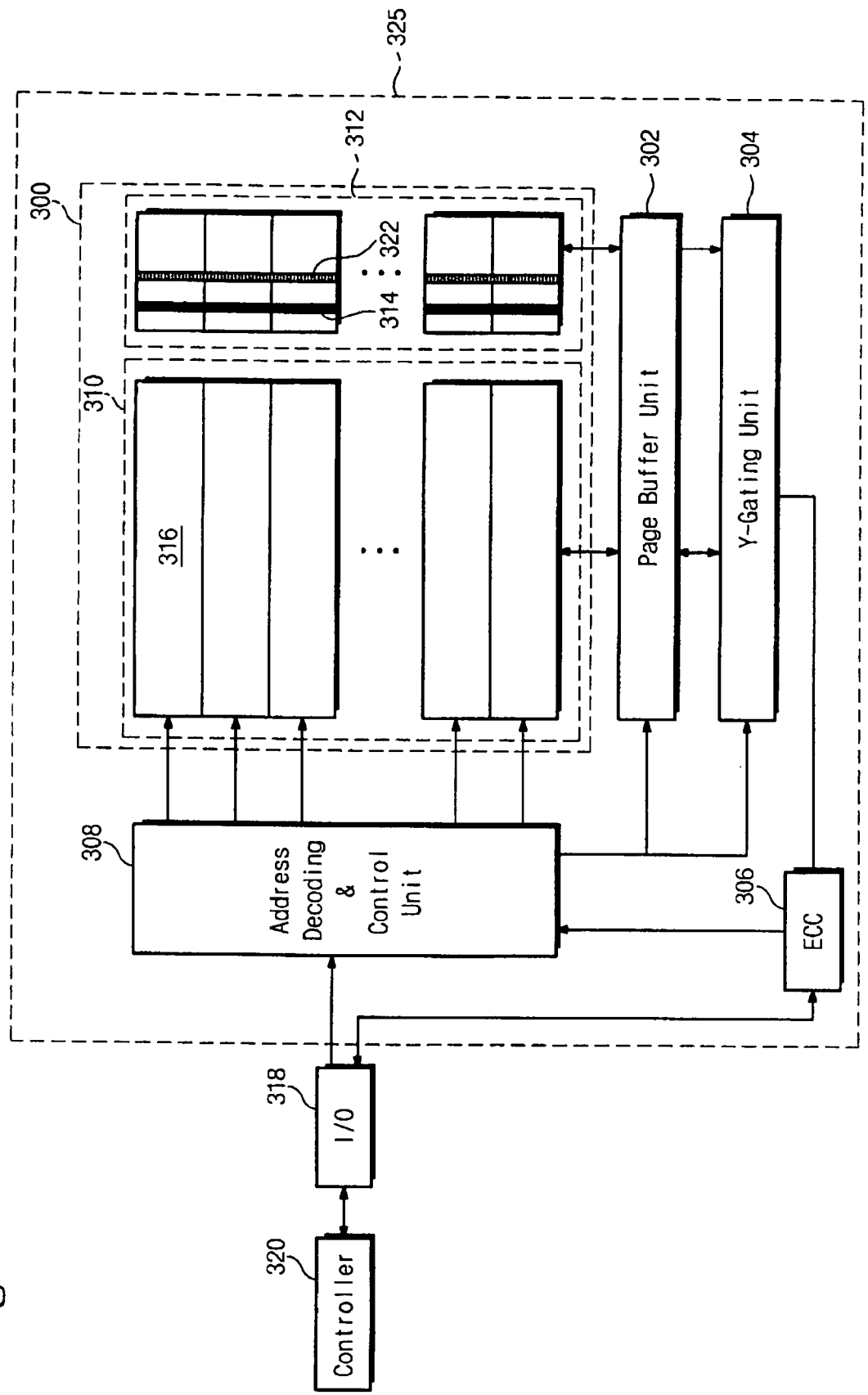
FIG. 3 illustrates a flash memory system according to an embodiment of the present invention.

FIG. 3 illustrates a flash memory system according to an embodiment of the present invention. As shown, a controller 320 controls the operation of one or more flash memory devices 325 via an input/output (I/O) interface 318. In FIG. 1, only one flash memory device 325 has been shown for the sake of clarity. The flash memory device includes an array 300 of transistor cells, each cell capable of non-volatile storage of one or more bits of data. The arrays of cells are partitioned into groups of cells referred to as erasable blocks 316. Each block 316 is further partitioned (not shown) into one or more addressable sectors or pages that are the basic unit for read and program functions. As further shown, the array 300 is divided into a main area 310 and a spare area 312. The main area 310 stores data as is well-known, and the spare area 312 includes bad block indicator 314 corresponding to each block 316 and a cell type indicator 322 corresponding to each block 316. As shown, the bad block indicators 314 may be stored in a single column and in several rows of the spare area 312. The cell type indicators 322 may be stored in a different, single column and in several rows of the spare area 312. It will be understood that the bad block indicators 314 and/or the cell type indicators 322 may be stored in more than one column. Also, each cell type indicator 322 and/or bad block indicator 314 may be a single cell or more than one cell associated with a block 316.

A bad block indicator 314 indicates whether the corresponding erasable block 316 is bad (i.e., includes an unusable cell) or not. The cell type indicator 322, in this embodiment, indicates whether the corresponding block 316 includes single level memory cells (SLCs) or multiple level memory cells (MLCs). More particularly, in this embodiment, the MLCs are four level MLCs where each MLC represents two bits.

An address decoding and control unit receives controls signals over the I/O interface 318 (e.g., a bus and/or buffer) from the controller 320. These signal may include, for example, a chip select signal (CS) used to active the flash memory, a read strobe (RS) signal used to indicate a data read operation, a write strobe (WS) signal used to indicate a write operation, and an address signal used to indicate the address of the memory array associated with the read or write operation. Based on the control signals, the address decoding and control unit 308 generates control signals for controlling the memory array 300, a page buffer unit 302 and a column gating unit 304 in the well-known manner. For example, the address and decoding control unit 308 controls the memory array 300, page buffer unit 302 and column gating unit 304 to perform read, program and erase operations consistent with read and write operations indicated by the control signals.

The page buffer unit 302 includes a plurality of page buffers (not shown), each associated with a column or columns of the memory array 300. Each page buffer stores data read from or for being written to a memory cell or cells in the associated column of the memory array 300. Each page buffer selectively operates based on the control signals from the address decoding and control unit 308. The column gating unit 304 selectively outputs the data from or inputs data to one of the page buffers in the page buffer unit 302 based on the control signals from the address decoding and control unit 308. The column selecting unit 304 is connected to the I/O interface 318 via an error detection and correction unit (ECC) 306, sends the read data over the I/O interface 318, and receives data for writing via the I/O interface 318. It will be appreciated that the data may be received and sent by the controller 320 or another external device.

The ECC unit 306 detects errors in the data to be written into or read from the memory array 310, and corrects the errors according to any well-known error correction scheme. However, because of a degraded memory cell, the errors in read data may be too large for the ECC unit 306 to correct. This ECC failure may be reported to the controller 320, which recognizes the read cells as possibly including a cell which has degraded to being unusable-an unusable cell.

The controller 320 also detects unusable cells of the array 310 in other ways. For example, one technique for detecting such cells is to verify, as part of a program and/or erase operation, that the program and/or erase operation has completed satisfactorily. Any well-known verify technique may be used. A verification failure results in a determination that the cell or cells in question may be unusable.

If the controller 320 detects potentially unusable cells, the controller 320 recognizes that a block 316 has an error (e.g., includes an unusable cell), and performs a cell management operation.

Figure 4:
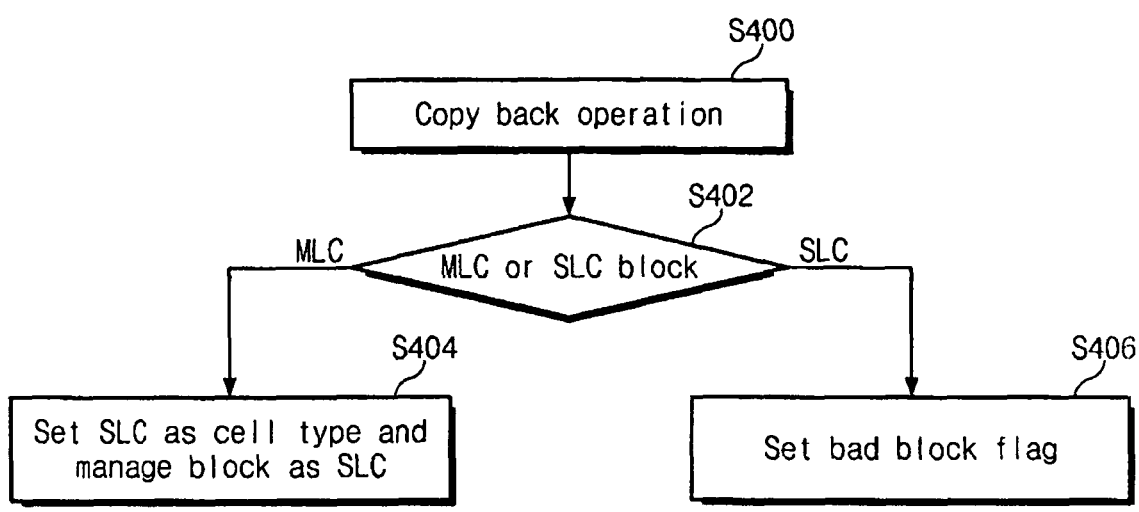
FIG. 4 illustrates a flow chart of a cell management operation according to one embodiment of the present invention.

FIG. 4 illustrates a flow chart of a cell management operation according to one embodiment of the present invention. As shown, after determining an error in a block 316, in step S400 the controller 320 performs a copy back operation on the block including the potentially unusable cell or cells. The copy back operation may be performed in any well-known manner. For example, assume the nth page of a block is determined to include potentially unusable cells as a result of a failed verification process during a write operation to the nth page. The controller 320 issues control signals to copy the first to (n−1)th pages of the block to the first to (n−1)th pages of a free block, writes the nth page in the free block pursuant to the write operation, and copies the remaining n+1, n+2, etc. pages of the unusable block to the free block. During this copy operation, ECC may be performed on the data being written to the free block; however, this is optional. It will be appreciated that the controller 320 may maintain, for example, a table or other management data regarding which blocks are free. This management information may be stored locally at the controller, in the flash memory device, etc. Furthermore, the free block may be a free block (e.g., an unused block) in the main area 310 or the spare area 312.

Figure 2A:
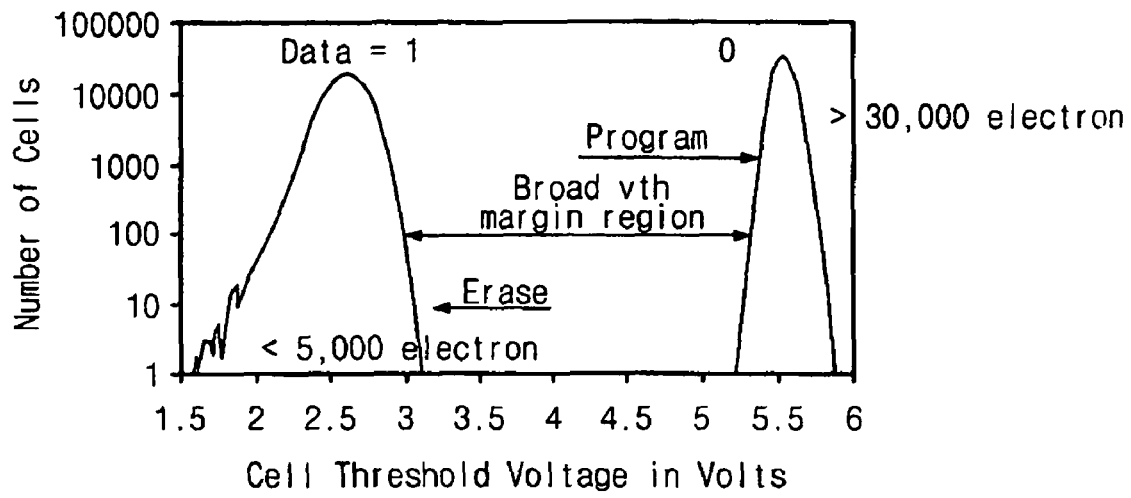
FIG. 2A illustrates the erasure and program threshold voltages of a useable single level transistor cell.
Figure 2B:
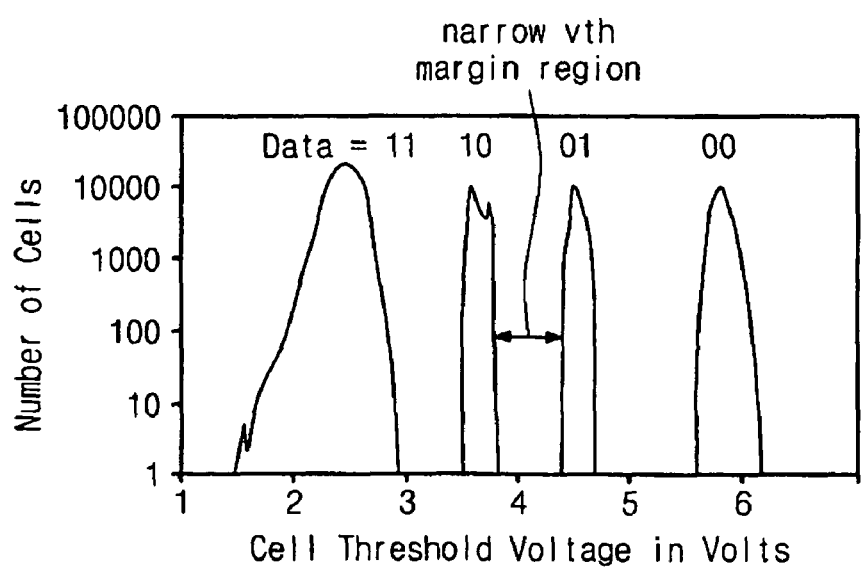
FIG. 2B illustrates the threshold states and associated bits for an example, useable four level MLC.

Next, in step S402 the controller 320 reads the cell type indicator 322 for the block including the potentially unusable cell or cells. In this embodiment, the cell type indicators 322 are each a single cell in the spare area 312 corresponding to a block 316. Each cell type indicator 322 is initially in the erased state, which represents that the corresponding block is an MLC block and includes MLCs. In this embodiment, a programmed state of the cell type indicator 322 indicates that the corresponding block is an SLC block and includes only SLCs. If the cell type indicator 322 indicates the block 316 including the potentially unusable cell is an MLC block, then in step S404, the controller 320 sets the cell type indicator 322 to indicate the block 316 is a SLC block. The controller 320 and the address decoding and control unit 308 will then store data in the block 316 by managing the block 316 as including only the SLC cells. For instance, the threshold levels of FIG. 2A will be used, whereas the threshold levels of FIG. 2B may have been used when the block was an MLC block. In this manner, the block 316 does not become completely unusable, and/or memory loss due to cell degradation is mitigated. Namely, step S404 results in a decrease in the bit storage capacity, but not elimination of the bit storage capacity.

Returning to step S402, if the controller 320 determines from the cell type indicator 322 that the block 316 is an MLC block, then the controller 320 sets the bad block flag 314 in the conventional manner to indicate the block is unusable. In this embodiment, each bad block indicator 314 is a single cell and is initially in the erased state, which represents that the corresponding block 316 is a good block and does not include unusable cells. In this embodiment, the programmed state of the bad block indicator 314 indicates that the corresponding block 316 is a bad block and includes at least one unusable cell.

It will be understood that the process of FIG. 4 may be implemented as a result of a program verification failure during a program operation, an erase verification failure during an erase operation, and/or a read failure during a read operation. For example, when a read request is received, the cell type indicator 322 for the block 316 address in the read request is accessed. Data is then read from the block 316 based on the cell type indicator 322. Namely, if the cell type indicator 322 indicates an SLC, then data is read based on the threshold states such as set forth in FIG. 2A. However, if the cell type indicator 322 indicates an MLC, then data is read based on the threshold states such as set forth in FIG. 2B. Read of data from SLC and MLC cells based on the associated threshold states is well-known and will not be described in detail for the sake of brevity. As discussed, during reading of the data, error correction is performed, for example by the ECC unit 306. If an ECC failure occurs the process of FIG. 4 is triggered. It will be appreciated that ECC failure may occur during reading of the least significant bit of an MLC or a most significant bit of an MLC. Either failure may trigger the process of FIG. 4.

Similar to that described above, a write operation may involve receiving a write request, and in response accessing the cell type indicator 322 for the block 316 addressed in the write request. Data is then programmed and/or erase from the block 316 based on the cell type indicator 322. Namely, if the cell type indicator 322 indicates an SLC, then data is programmed and/or erased based on the threshold states such as set forth in FIG. 2A. However, if the cell type indicator 322 indicates an MLC, then data is programmed and/or erase based on the threshold states such as set forth in FIG. 2B. Programming and/or erasure of data from SLC and MLC cells based on the associated threshold states is well-known and will not be described in detail for the sake of brevity. As discussed, during writing of the data, error correction may be performed, for example by the ECC unit 306. If an ECC failure occurs the process of FIG. 4 is triggered.

Figure 5:
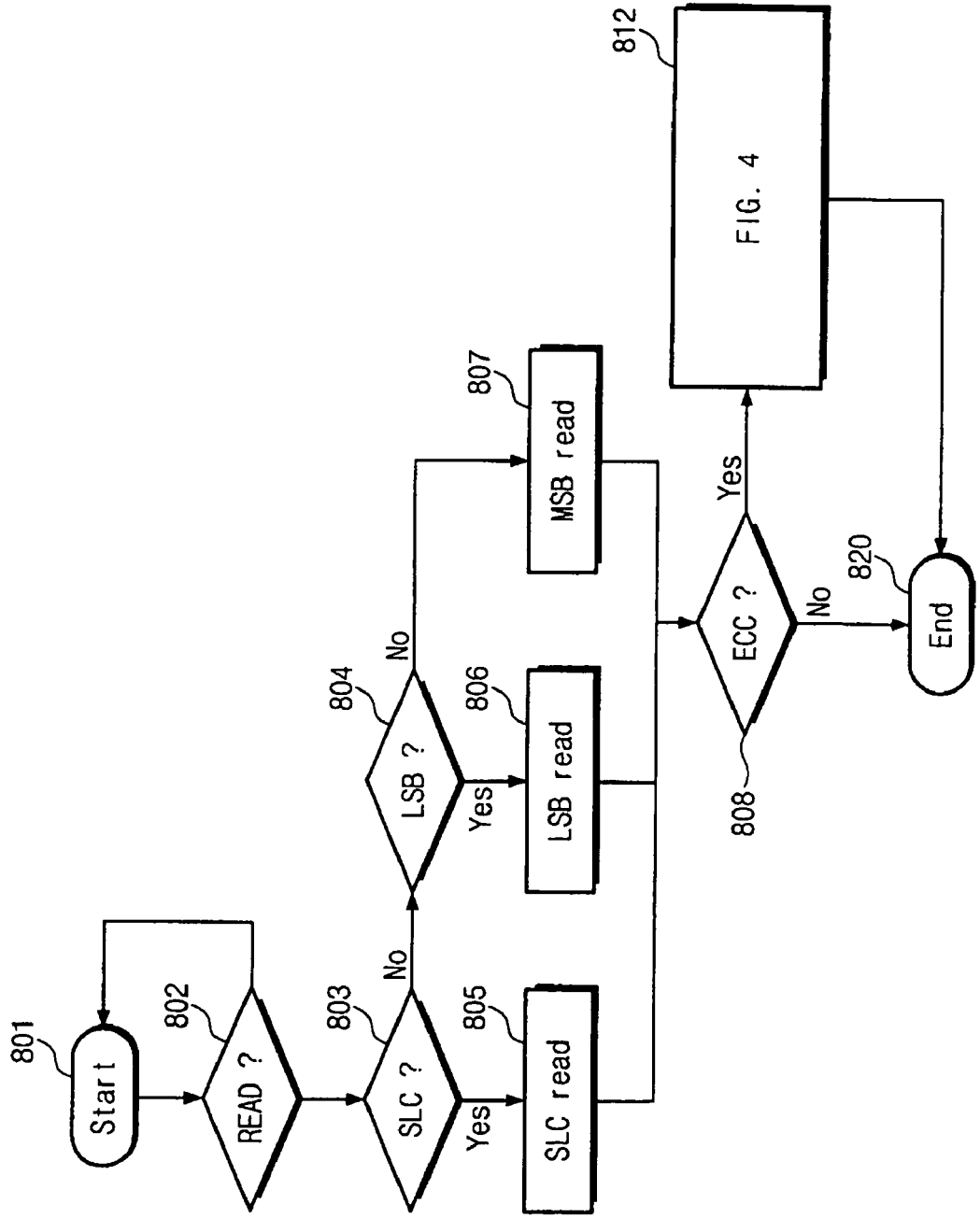
FIG. 5 is a flowchart illustrating a read operation according to an embodiment of the present invention.

FIG. 5 is a flowchart illustrating a read operation according to an embodiment of the present invention. The read operation method includes determining whether an externally input command is read command (S802); reading cell type indicator for a main storage region of a memory cell array when the externally input command is a read command, the cell type indicator being stored in a spare storage region of the memory cell (S803); checking an address of stored bits per cell when the cell type indicator indicates a multi-valued nonvolatile memory (S804); conducting different read operations according to the address of the stored bits per cell (S806 and S807); and conducting a single value read operation when the cell type indicator indicates a single-valued nonvolatile memory (S805). According to the respective cases, the step S808 is performed to detect whether there is an error in read-out information. When an error is detected the method of FIG. 4 may be invoked.

Figure 6:
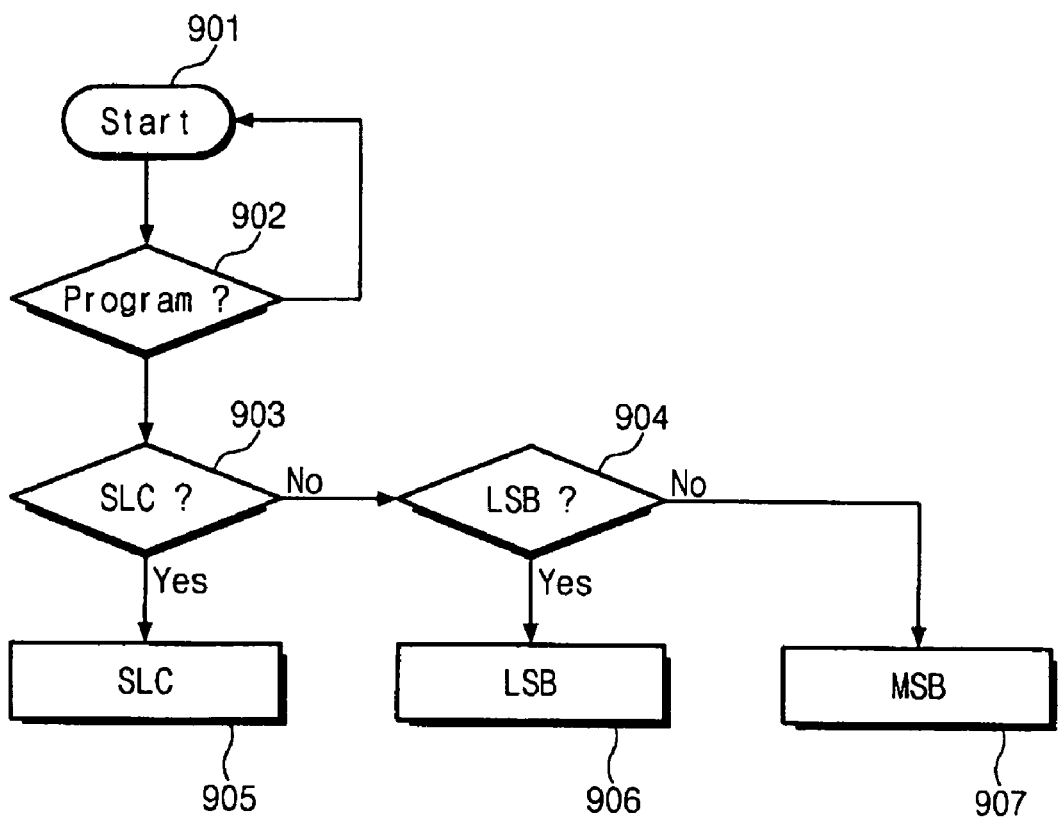
FIG. 6 is a flowchart illustrating a write operation according to an embodiment of the present invention.

FIG. 6 is a flowchart illustrating a write operation according to an embodiment of the present invention. The write operation method includes determining whether an externally input command is a write command (S902); verifying an cell type indicator to check bit-per-cell information of a corresponding block (S903); conducting a write operation in case of a single-valued nonvolatile memory (905); checking an address of each bit in case of a multi-valued nonvolatile memory; and conducting a write operation according to corresponding addresses (S907 and S908).

Figure 7:
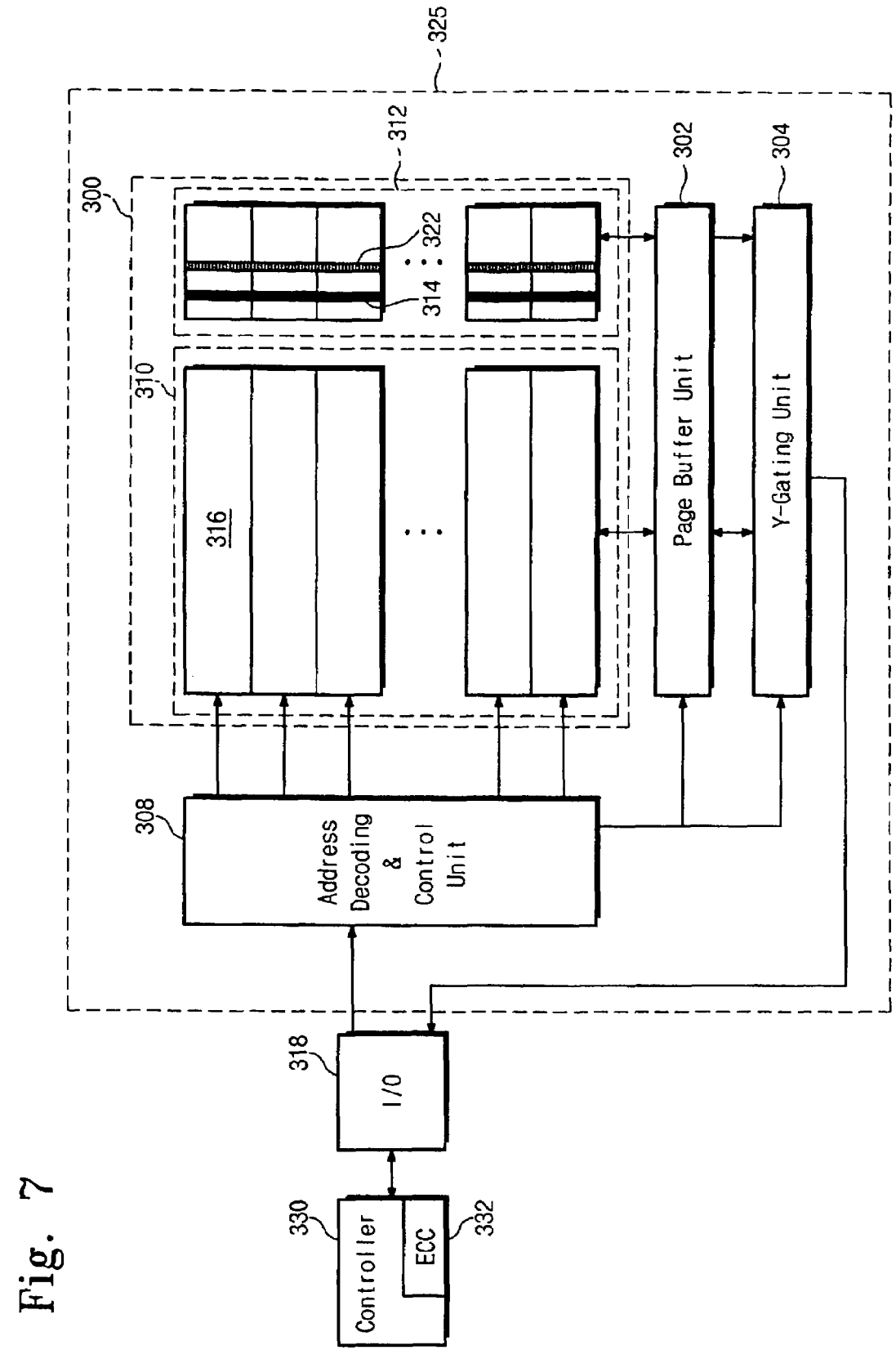
FIG. 7 illustrates a flash memory system according to another embodiment of the present invention.

FIG. 7 illustrates a flash memory system according to another embodiment of the present invention. This embodiment is the same as FIG. 3, except that the ECC unit of FIG.

3 no longer exists in the flash memory device 325. Instead, the controller 320 of FIG. 3 has been replaced with a controller 330 that includes the ECC function 332. The operation of the embodiment illustrated in FIG. 7 is the same as discussed above with respect to FIGS. 3 and 4.

Figure 8:
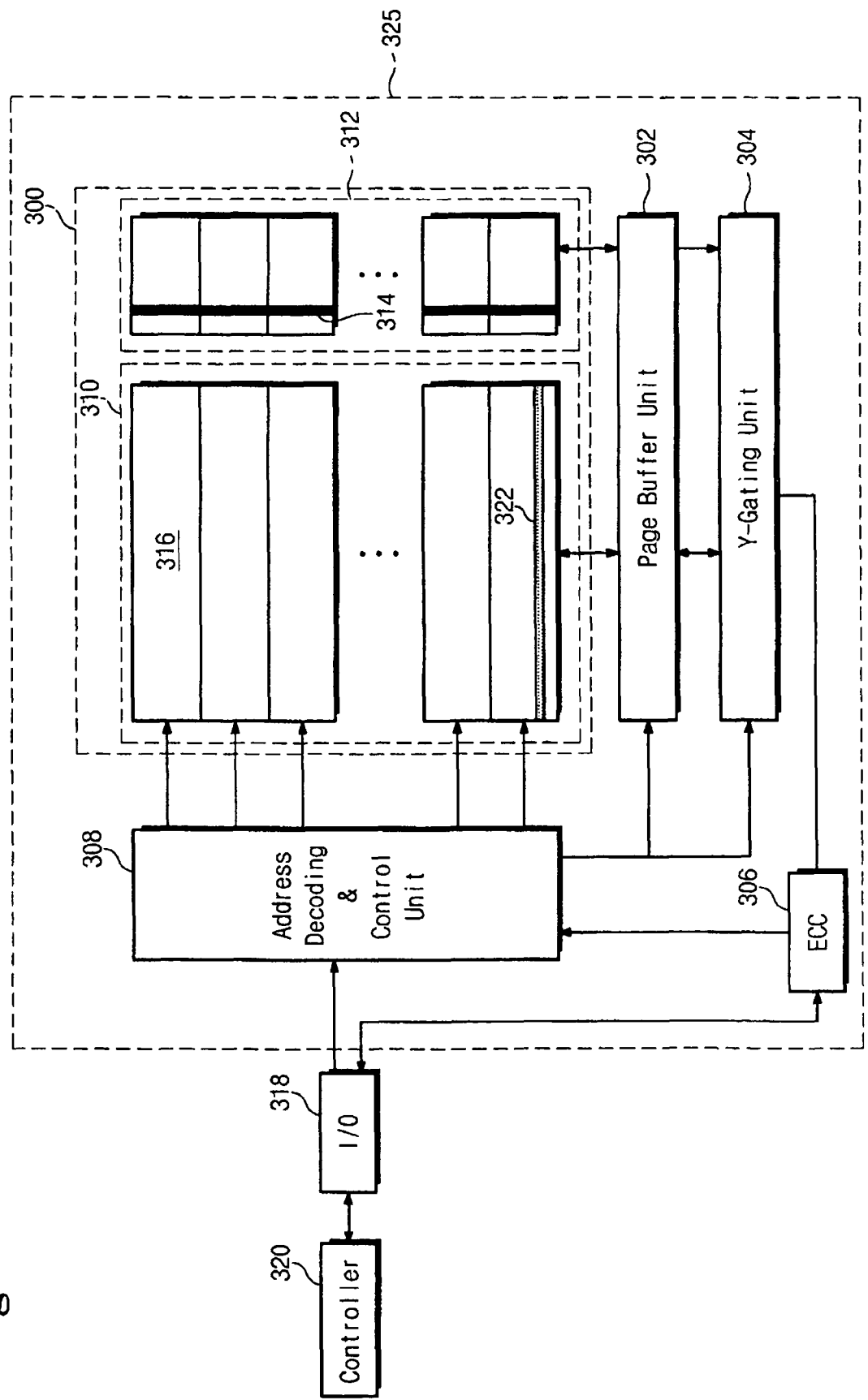
FIG. 8 illustrates a flash memory system according to a further embodiment of the present invention.

FIG. 8 illustrates a flash memory system according to a further embodiment of the present invention. This embodiment is the same as FIG. 3, except that the cell type indicators 322 are stored in a row of cells over different columns in the main area 310. It will be appreciated that the cell type indicators 322 may be stored in more than one row. As will be further appreciated, reading all the cell type indicators 322 in the embodiment of FIG. 3 requires activating a word line for each cell type indicator 322. By contrast, reading the cell type indicators 322 in the embodiment of FIG. 8 requires activating one or only a few word lines (in comparison) depending on the number of cell type indicators 322.

While FIG. 8 illustrates the cell type indicators 322 as stored at the bottom of the main area 310 of the memory array 300, it will be appreciated that the cell type indicators 322 may be stored at any position within the memory array 310 (e.g., top row, middle row, etc.).

Furthermore, in the same manner that the cell type indicators 322 are stored in the main area 310, the bad block indicators 314 may also be stored in the main area 310. Still further, the bad block indicators 314 may be stored in a row of the main area 310 while the cell type flags 322 are stored in columns of the spare area 312.

Except for differences in accessing the bad block indicators 314 and/or the cell type indicators 322, the embodiment of FIG. 8 and the variations discussed above, operate in the same manner as discussed above with respect to FIGS. 3 and 4.

Furthermore, while the embodiments were described for the cell types of an SLC and a four level (or 2 bit) MLC, it will be appreciated that the present invention is not limited to these cell types or to having only two cell types. Instead, the flash memory device may includes at least one of i-value cells and j-value cells, where each i-value cell is for storing i-bits of data and each j-value cell is for storing j-bits of data. In this example, j is greater than i, and may be an integer equal to or greater than 2. For example, if j is 4, then the j-value cells store 4 bits, and the i-value cells may be store 2 bits. If an error is detected in a block having j-value cells, the cell type of the block may be changed to (j-x)-value cells, which may be an i-value cell, where x may be selected from the group of $2^p$ for an integer p greater than or equal to zero. Eventually, the value of the cells in a block may be reduced to that of an 1-bit cell (i.e., an SLC). And, if an error is detected in the SLC, then the bad block indicator is set. As will be appreciated, if the number of cell types exceeds 2, then more than one cell will be used as the cell type indicator for each block.

Accordingly, the cell type indicator is a form of storage capacity indicator, which indicates a bit storage capacity of cells in the associated block. A storage capacity of a block indicated by an associated storage capacity indicator may be reduced if an error in at least a portion of the block is detected and a current storage capacity indicated by the associated storage capacity indicator is greater than a first threshold number (e.g., greater than 1 bit). Also, a bad block indicator of a block associated with the bad block indicator may be changed to indicate the associated block is unusable if an error in at least a portion of the block is detected and the current storage capacity indicated by the associated storage capacity indicator is equal to a second threshold number (e.g., equal to 1 bit). As will be appreciated, the first and second threshold numbers may be different or the same.

As will be further appreciated, instead of having a bad block indicator and a separate cell type indicator, a single indicator may be used. For example, a multi-bit indicator may have different values indicating bad block, SLC, MLC of four states, etc.

While the embodiments of the present invention were described above with respect to managing the array 300 on a block basis, it will be understood that the array 300 may be managed on a sector or page basis, a row basis, a column basis, a plurality of rows basis, etc. The basis (e.g., page, row, etc.) will have an associated bad basis indicator and cell type indicator.

Figure 9:
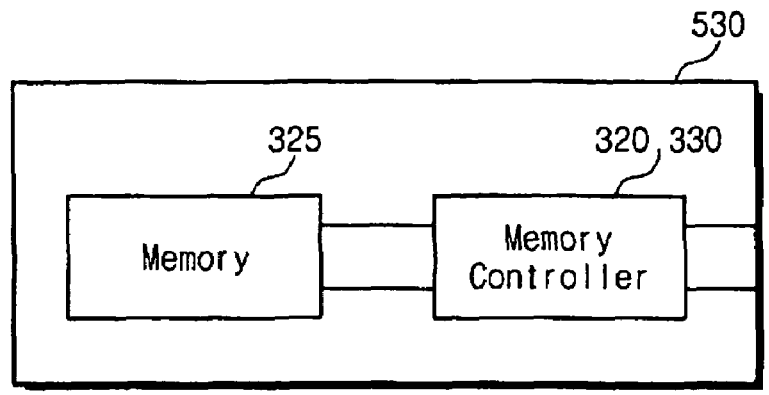
FIGS. 9-13 illustrate additional example embodiments employing a flash memory system according to the present invention.

FIG. 9 illustrates yet another embodiment. This embodiment includes the flash memory device and controller according to any of the above described embodiments, except that the flash memory device 325 and memory controller 320/330 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the memory controller 320, 330 may control the memory 325 based on controls signals received by the card 530 from another (e.g., external) device.

Figure 10:
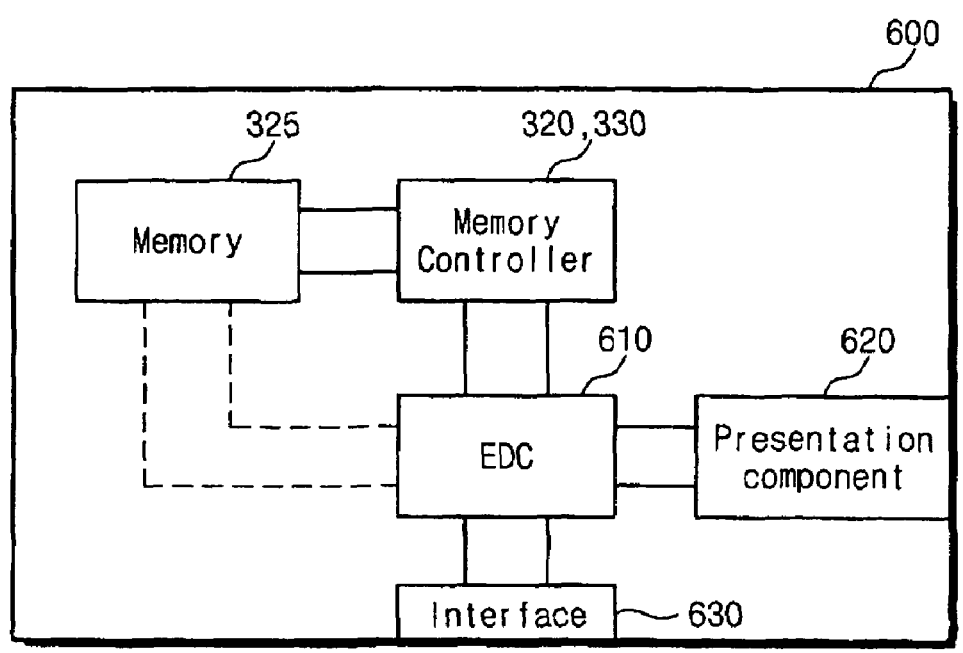

FIG. 10 illustrates a further embodiment. This embodiment represents a portable device 600. The portable device 600 may be an MP3 player, video player, combination video and audio player, etc. As shown, the portable device 600 includes the memory 325 and memory controller 320, 330. The portable device 600 may also includes an encoder and decoder 610, presentation components 620 and interface 630.

Data (video, audio, etc.) is input to and output from the memory 325 via the memory controller 320, 330 by an encoder and decoder (EDC) 610. As shown by the dashed lines in FIG. 10, the data may be directly input to the memory 325 from the EDC 610 and/or directly output from the memory 325 to the EDC 610.

The EDC 610 encodes data for storage in the memory 325. For example, the EDC 610 may perform MP3 encoding on audio data for storage in the memory 325. Alternatively, the EDC 610 may perform MPEG encoding (e.g., MPEG2, MPEG4, etc.) on video data for storage in the memory 325. Still further, the EDC 610 may include multiple encoders for encoding different types of data according to different data formats. For example, the EDC 610 may include an MP3 encoder for audio data and an MPEG encoder for video data.

The EDC 610 may decode output from the memory 325. For example, the EDC 610 may perform MP3 decoding on audio data output from the memory 325. Alternatively, the EDC 610 may perform MPEG decoding (e.g., MPEG2, MPEG4, etc.) on video data output from the memory 325. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 320, 330 and/or the memory 325.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 325 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 11:
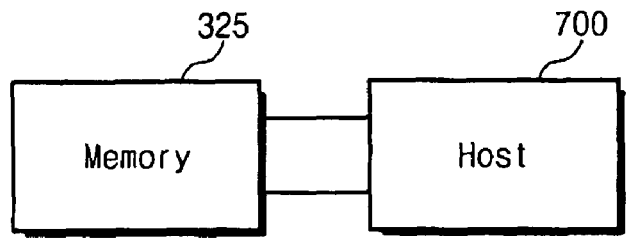

FIG. 11 illustrates a still further embodiment of the present invention. As shown, the memory 325 may be connected with a host system 700. The host system 700 may be a processing system such as a personal computer, digital camera, etc. The host system 700 may use the memory 325 as a removable storage medium. As will be appreciated, the host system 700 supplies the input signals for controlling operation of the memory 325.

Figure 12:
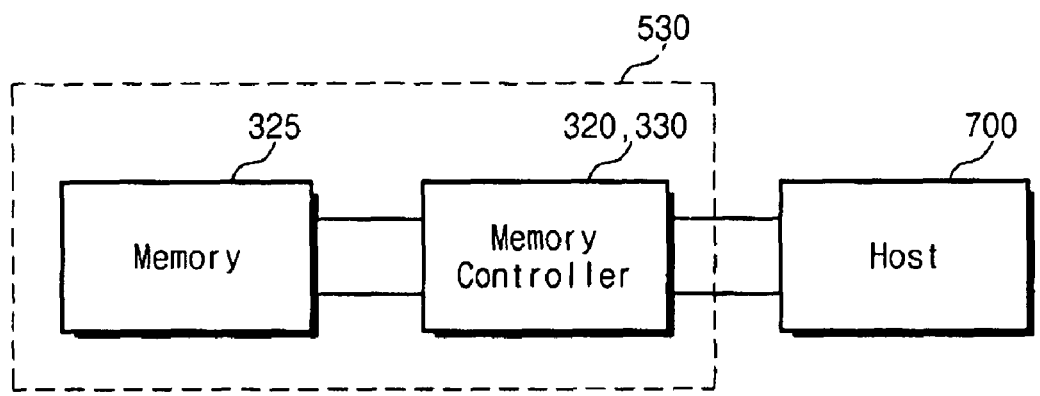

FIG. 12 illustrates an embodiment of the present invention in which the host system 700 is connected to the card 530 of FIG. 9. In this embodiment, the host system 700 applies control signals to the card 530 such that the memory controller 320, 330 controls operation of the memory 325.

Figure 13:
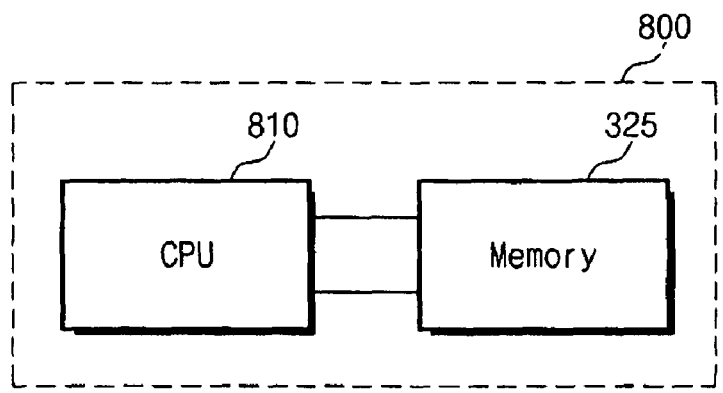

FIG. 13 illustrates a further embodiment of the present invention. As shown, the memory 325 may be connected to a central processing unit (CPU) 810 within a computer system 800. For example, the computer system 800 may be a personal computer, personal data assistant, etc. The memory 325 may be directly connected with the CPU 810, connected via bus, etc. It will be appreciated, that FIG. 13 does not illustrate the full complement of components that may be included within a computer system 800 for the sake of clarity.

The invention being thus described, it will be obvious that the same may be varied in many ways. Such variations are not to be regarded as a departure from the invention, and all such modifications are intended to be included within the scope of the invention.

We claim:

1. A method of managing a flash memory, comprising:
   determining a type of cells in a block of the flash memory; and
   if an error is detected in at least a portion of the block, selectively changing a cell type indicator associated with the block or marking the block as a bad block based on the determined type of cells in the block, the cell type indicator indicating a type of the cells in the associated block.

2. The method of claim 1, wherein the selectively changing step changes the cell type indicator to indicate the block includes single-level cells if the determining step determines that the block includes multi-level cells.

3. The method of claim 2, wherein the block is marked as a bad block bad block to indicate the block is unusable if the determining step determines that the block includes single-level cells.

4. The method of claim 1, wherein the block is marked as a bad block to indicate the block is unusable if the determining step determines that the block includes single-level cells.

5. The method of claim 1, further comprising:
   storing cell type indicators associated with respective blocks of the flash memory in a spare area of the flash memory, the flash memory including a main data area and a spare area.

6. The method of claim 5, wherein the storing step stores a plurality of the cell type indicators in a same column and different rows of the spare area.

7. The method of claim 1, further comprising:
   storing cell type indicators associated with respective blocks of the flash memory in a main data area of the flash memory, the flash memory including a main data area and a spare area.

8. The method of claim 1, wherein the determining step examines the cell type indicator associated with the block to determine whether the block includes one of single-level cells and multi-level cells.

9. The method of claim 1, further comprising:
   detecting an error in the block.

10. The method of claim 9, wherein the detecting step detects an error in the block during a read operation where data is read from the block.

11. The method of claim 9, wherein the detecting step uses error correction coding to detect the error.

12. The method of claim 1, further comprising:
    copying data from the block to an empty block if an error is detected in at least a portion of the block.

13. The method of claim 12, wherein the flash memory includes a main data area and a spare area, and the empty block is in a spare area.

14. The method of claim 12, wherein the flash memory includes a main data area and a spare area, and the empty block is in a main data area.

15. The method of claim 1, further comprising:
    examining a cell type indicator associated with a block including data for which a read request has been received;
    reading data from the block based on the examined cell type indicator;
    detecting an error in the read data; and wherein
    the determining step determines the type of cells in the block based on the examined cell type indicator.

16. The method of claim 1, wherein
    the determining step determines a bit storage capacity of a single cell in the block as the type of the block; and
    the selectively changing step reduces the bit storage capacity of the cells included in the block as indicated by the cell type indicator if the determining step determines that the bit storage capacity of a single cell in the block is greater than one.

17. A method of managing a flash memory that includes at least one of i-value cells and j-value cells, each i-value cell for storing i-bits of data and each j-value cell for storing j-bits of data where j is greater than i, comprising:
    determining whether a block in the flash memory includes one of i-value cells and j-value cells; and if an error is detected in at least a portion of a block, selectively changing a cell type indicator associated with the block based on the determining step, the cell type indicator indicating a type of the cells in the associated block, or marking the block as a bad block indicating the associated block is not a usable block.

18. The method of claim 17, wherein the selectively changing step changes the cell type indicator to indicate the block includes i-value cells if the determining step determines that the block includes j-value cells.

19. The method of claim 18, wherein the selectively changing step changes the cell type indicator to indicate the block includes (i-x)-value cells if the determining step determines that the block includes i-value cells and (i-x) is greater than or equal to 1, x being an integer greater than 0 and less than i.

20. The method of claim 19, wherein the block is marked as a bad block to indicate the block is unusable if the determining step determines that the block includes single-level cells.

21. The method of claim 17, wherein the selectively changing step changes the cell type indicator to indicate the block includes (i-x)-value cells if the determining step determines that the block includes i-value cells and (i-x) is greater than or equal to 1, x being an integer greater than 0 and less than i.

22. The method of claim 17, wherein the block is marked as a bad block to indicate the block is unusable if the determining step determines that the block includes single-level cells.

23. A method of managing a flash memory, comprising:
reducing a storage capacity of a block if an error in at least a portion of the block is detected and a current storage capacity of the block is greater than a first threshold number, the storage capacity being a bit storage capacity of cells in the block; and
marking the block as a bad block to indicate the block is unusable if an error in at least a portion of the block is detected and the current storage capacity of the block is equal to a second threshold number.

24. The method of claim 23, wherein the first threshold number and the second threshold number are equal.

25. The method of claim 24, wherein the first threshold number is one.

26. The method of claim 23, further comprising:
monitoring the blocks of the flash memory for errors.

27. A method of reading data from a flash memory, comprising:
examining a cell type indicator associated with a block including data for which a read request has been received;
reading data from the block based on the examined cell type indicator;
detecting an error in the read data; and
selectively changing the cell type indicator associated with the block or marking the block as a bad block based on the examined cell type indicator if the detecting step detects an error in the read data.

28. The method of claim 27, further comprising:
copying data stored in the block to an empty block if the detecting step detects an error in the read data.

29. A flash memory system, comprising:
a memory cell array divided into a plurality of blocks;
an error detecting unit configured to detect an error in at least a portion of a block; and
a controller configured to determine a type of cells in the block, and configured to selectively change a cell type indicator associated with the block or mark the block as a bad block based on the determination in response to an error being detected in at least a portion of the block, the cell type indicator indicating a type of the cells in the associated block.

30. The system of claim 29, wherein the controller is configured to selectively change the cell type indicator to indicate the block includes single-level cells if the determining step determines that the block includes multi-level cells.

31. The system of claim 30, wherein the controller is configured to mark the block as a bad block to indicate the block is unusable if the determining step determines that the block includes single-level cells.

32. The system of claim 29, wherein the controller is configured to mark the block as a bad block to indicate the block is unusable if the determining step determines that the block includes single-level cells.

33. A flash memory system, comprising:
a memory cell array divided into a plurality of blocks;
a controller configured to determine a type of cells in a block and to selectively change a cell type indicator associated with the block or mark the block as a bad block based on the determination in response to detection of an error in the block, the cell type indicator indicating a type of the cells in the associated block.

34. The device of claim 33, wherein the controller is configured to selectively change the cell type indicator to indicate the block includes single-level cells if the determining step determines that the block includes multi-level cells.

35. The method of claim 34, wherein the controller is configured to mark the block as a bad block to indicate the block is unusable if the determining step determines that the block includes single-level cells.

36. The method of claim 33, wherein the controller is configured to mark the block as a bad block to indicate the block is unusable if the determining step determines that the block includes single-level cells.

* * * * *